United States Patent
Sakagami et al.

(10) Patent No.: US 8,907,254 B2
(45) Date of Patent: Dec. 9, 2014

(54) HEATING CONTROL SYSTEM, DEPOSITION DEVICE PROVIDED THEREWITH, AND TEMPERATURE CONTROL METHOD

(75) Inventors: Hidekazu Sakagami, Osaka (JP); Toshinori Okada, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 281 days.

(21) Appl. No.: 13/577,109

(22) PCT Filed: Mar. 29, 2011

(86) PCT No.: PCT/JP2011/057825
§ 371 (c)(1),
(2), (4) Date: Aug. 3, 2012

(87) PCT Pub. No.: WO2011/125654
PCT Pub. Date: Oct. 13, 2011

(65) Prior Publication Data
US 2013/0020311 A1 Jan. 24, 2013

(30) Foreign Application Priority Data
Apr. 8, 2010 (JP) .................................. 2010-089545

(51) Int. Cl.
H05B 1/02 (2006.01)
H01L 21/67 (2006.01)
C23C 16/46 (2006.01)
C23C 16/52 (2006.01)

(52) U.S. Cl.
CPC .......... *H01L 21/67248* (2013.01); *C23C 16/46* (2013.01); *C23C 16/52* (2013.01)
USPC ........... 219/482; 219/485; 219/486; 219/488; 219/494; 219/497; 118/725; 156/345.27; 156/345.52

(58) Field of Classification Search
CPC .. H01L 21/67248; C23C 16/46; C23C 16/52; H05B 1/0233; H05B 3/0047; H05B 3/28; H05B 3/283
USPC ............ 219/121.43, 482, 485, 483, 486, 488, 219/497, 494; 118/725; 156/345.27, 345.52
See application file for complete search history.

(56) References Cited

U.S. PATENT DOCUMENTS 7,049,553 B2 * 5/2006 Shigetomi et al. ............ 219/482
7,346,273 B2 * 3/2008 Tanaka et al. ................. 392/418
(Continued)

FOREIGN PATENT DOCUMENTS

| JP | 2001-210596 | 8/2001 |
|---|---|---|
| JP | 2004-111819 | 4/2004 |
| JP | 2006-269868 | 10/2006 |
| JP | 2007-335500 | 12/2007 |

(Continued)

OTHER PUBLICATIONS
International Search Report for International Application No. PCT/JP2011/057825 (Jun. 7, 2011).

*Primary Examiner* — Mark Paschall
(74) *Attorney, Agent, or Firm* — Edwards Wildman Palmer LLP; David G. Conlin; Steven M. Jensen (57) ABSTRACT

A heating control system which allows a plurality of heaters to heat an object without depending on a variation in characteristics among a plurality of heater power sources includes: a thermocouple which detects a temperature of an object to be heated; temperature control means that receives a target temperature and a current temperature, and carries out electric power control so that these temperatures match; electric current and voltage detecting means for detecting an electric power value and a current electric power; and target electric power calculating means that receives the electric power value, and calculates the target electric power by multiplying the electric power value by a given ratio. The temperature control means receives the target electric power and the current electric power, and carries out electric power control so that the current electric power matches the target electric power.

5 Claims, 8 Drawing Sheets

(56) References Cited

U.S. PATENT DOCUMENTS

| | | | |
|---|---|---|---|
| 2001/0054387 A1* | 12/2001 | Frankel et al. | 118/725 |
| 2003/0121905 A1* | 7/2003 | Nanno et al. | 219/494 |
| 2005/0266685 A1 | 12/2005 | Nakano et al. | |
| 2007/0010033 A1* | 1/2007 | Aderhold et al. | 438/14 |

FOREIGN PATENT DOCUMENTS

| | | |
|---|---|---|
| JP | 2009-074148 | 4/2009 |
| JP | 2009-170822 | 7/2009 |
| JP | 2009-186933 | 8/2009 |
| TW | 200941621 | 10/2009 |

* cited by examiner

HEATING CONTROL SYSTEM, DEPOSITION DEVICE PROVIDED THEREWITH, AND TEMPERATURE CONTROL METHOD

TECHNICAL FIELD

The present invention relates to a heating control system which causes a plurality of heaters to subject an object to be heated to temperature control, a deposition device including the heating control system, and a temperature control method.

BACKGROUND ART

A process for depositing a thin film on a substrate is exemplified by an MOCVD (Metal Organic Chemical Vapor Deposition) method which causes a compound semiconductor crystal to grow. The MOCVD method is used in production of a light emitting diode, a semiconductor laser, a space solar power device, and a high-speed device.

According to the MOCVD method, a substrate is mounted on a mounting table first, and the substrate is heated by use of a heater. Subsequently, as source gasses contributing to deposition, an organic metallic gas such as trimethyl gallium (TMG) and a hydride gas such as ammonia ($NH_3$) are injected onto the substrate, so as to cause a vapor phase reaction. Then, a compound semiconductor crystal is deposited on the substrate. In such a deposition process, it is necessary to cause a temperature of the substrate to be uniform so as to secure high in-plane uniformity. Alternatively, it is necessary to set an appropriate temperature distribution pattern suitable for a deposition device. Therefore, zone control which causes a plurality of heaters to carry out temperature control is known as a method for subjecting a substrate to temperature control (see Patent Literature 1, for example).

Figure 7:
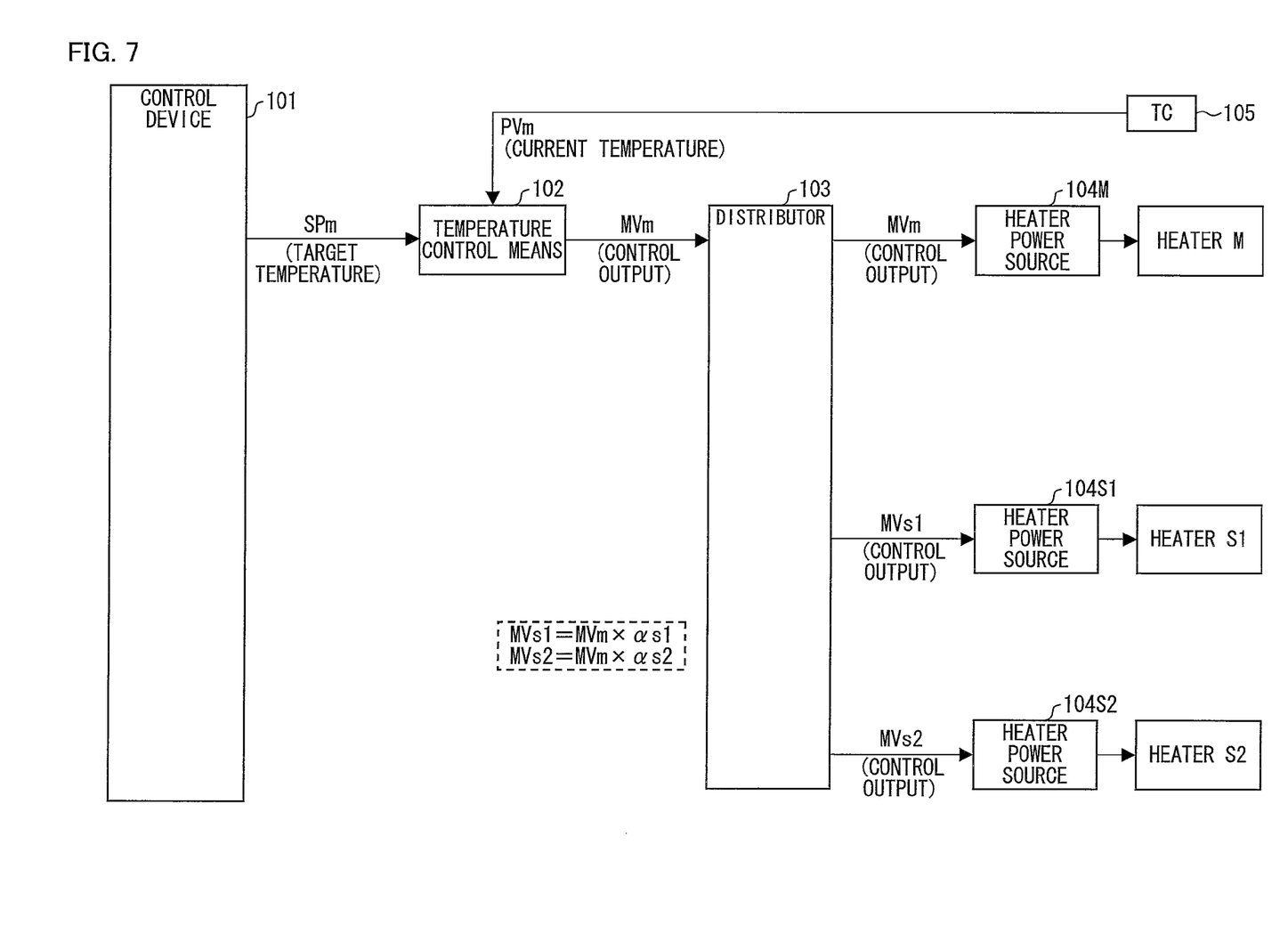
FIG. 7 is a block diagram showing an arrangement of a conventional heating control system.

FIG. 7 is a block diagram showing an arrangement of a zone control system which causes a plurality of heaters to carry out temperature control as described above. Note that FIG. 7 shows a case of zone control which uses three heaters that are a main heater M and two sub heaters S1 and S2.

A conventional heating control system includes a control device 101 such as a sequencer which serves a host device, temperature control means 102, a distributor 103, a heater power source 104M which is a power source of the main heater M, heater power sources 104S1 and 104S2 which are power sources of the respective sub heaters S1 and S2, and a thermocouple (TC) 105 (see FIG. 7).

According to the conventional heating control system, the control device 101 sets a target temperature SPm for the temperature control means 102. The temperature control means 102 receives a current temperature PVm as a detection temperature detected by the thermocouple 105 which is provided in a vicinity of the heater. Then, the temperature control means 102 outputs a control output MVm obtained by PID arithmetic operation performed based on the target temperature SPm and the current temperature PVm. The distributor 103 temporarily stores the control output MVm. Thereafter, the distributor 103 supplies the control output MVm to each of the heater power sources 104M, 104S1, and 104S2 of the respective heaters.

The heater power source M for the main heater M receives, from the distributor 103, an output value Mvm of the temperature control means 102. The heater power sources S1 and S2 for the respective sub heaters S1 and S2 receive respective output values MVs1 and MVs2. The output values MVs1 and MVs2 are obtained based on the respective following equations (1) and (2) by multiplying the output value MVm of the temperature control means 102 by respective constant ratios $\alpha s1$ and $\alpha s2$ in the distributor 103.

$$MVs1 = MVm \times \alpha s1 \quad (1)$$

$$MVs2 = MVm \times \alpha s2 \quad (2)$$

In this case, if each of the heater power sources 104S1 and 104S2 is a power source having an electric power control specification, electric power having the constant ratios ($\alpha s1$ and $\alpha s2$) with respect to electric power to be supplied to the main heater M is supplied to the respective sub heaters S1 and S2.

CITATION LIST

Patent Literature

Patent Literature 1
Japanese Patent Application Publication, Tokukai, No. 2009-74148A (Publication Date: Apr. 9, 2009)

SUMMARY OF INVENTION

Technical Problem

However, heater power sources vary in output characteristics (relationship between an input signal and an output value). Therefore, according to the conventional heating control system shown in FIG. 7, a variation occurs between ratios of electric power to be actually supplied to the respective sub heater S1 and S2 (to electric power to be supplied to the main heater M) and respective preset ratios ($\alpha s1$ and $\alpha s2$).

The present invention has been made in view of the problems, and an object of the present invention is to provide a heating control system which is independent of a variation in characteristics among a plurality of heater power sources, a deposition device including the heating control system, and a temperature control method.

Solution to Problem

In order to attain the object, a heating control system of the present invention includes: a main heater and a sub heater each of which is used to heat an object to be heated; and a main heater power source which supplies a first electric power to the main heater, and a sub heater power source which supplies a second electric power to the sub heater, the main heater being subjected to temperature control so that the object to be heated has a preset target temperature, and the sub heater being subjected to electric power control so that the first electric power to be supplied to the main heater and the second electric power to be supplied to the sub heater are in a given ratio, the heating control system further including: temperature detecting means for detecting a detection temperature of the object to be heated; main heater temperature control means and sub heater temperature control means; main heater electric power detecting means for detecting a first electric power detection value, and sub heater electric power detecting means for detecting a second electric power detection value; and target electric power calculating means for calculating a second electric power target value, the main heater temperature control means receiving the preset target temperature and the detection temperature detected by the temperature detecting means, and controlling the first electric power so that the detection temperature matches the preset target temperature, the target electric power calculating means receiving the first electric power detection value detected by the main heater electric power detecting means, and calculating the second electric power target value by multiplying the first electric power detection value by the given ratio, and the sub heater temperature control means receiving the second electric power target value and the second electric power detection value detected by the sub heater electric power detecting means, and controlling the second electric power so that the second electric power detection value matches the second electric power target value.

The heating control system of the present invention is a system which carries out heating control, i.e., zone control, the heating control system including: a main heater and a sub heater each of which is used to heat an object to be heated; and a main heater power source which supplies a first electric power to the main heater, and a sub heater power source which supplies a second electric power to the sub heater, the main heater being subjected to temperature control so that the object to be heated has a preset target temperature, and the sub heater being subjected to electric power control so that the first electric power to be supplied to the main heater and the second electric power to be supplied to the sub heater are in a given ratio.

According to the arrangement, the main heater temperature control means receives the preset target temperature and the detection temperature detected by the temperature detecting means, and controls the first electric power so that the detection temperature matches the preset target temperature. Meanwhile, the sub heater temperature control means receives the second electric power target value and the second electric power detection value detected by the sub heater electric power detecting means, and controls the second electric power so that the second electric power detection value matches the second electric power target value. In this case, the target electric power calculating means calculates the second electric power target value. The target electric power calculating means receives the first electric power detection value detected by the main heater electric power detecting means, and calculates the second electric power target value by multiplying the first electric power detection value by the given ratio.

As described earlier, the sub heater temperature control means carries out electric power control by feeding back the second electric power detection value detected by the sub heater electric power detecting means. This allows no consideration to be taken into a variation in output characteristics regardless of output specifications of the sub heater power source. Further, the target electric power calculating means calculates the first electric power detection value, i.e., calculates the second electric power target value based on the first electric power to be actually supplied to the main heater. Therefore, no variation can occur between (i) a ratio between the first electric power to be actually supplied to the main heater and the second electric power to be actually supplied to the sub heater and (ii) a preset given ratio. Therefore, the arrangement allows the ratio between the first electric power and the second electric power to be constant.

As described earlier, according to the arrangement, it is possible to achieve a heating control system which is independent of a variation in characteristics among a plurality of heater power sources.

In order to attain the object, a temperature control method of the present invention in which in order to cause a main heater and a sub heater to heat an object to be heated, the main heater is subjected to temperature control so that the object to be heated has a preset target temperature, and the sub heater is subjected to electric power control so that a first electric power to be supplied to the main heater and a second electric power to be supplied to the sub heater are in a given ratio, the temperature control method includes the steps of: a) detecting a detection temperature of the object to be heated; b) controlling the first electric power so that the detection temperature detected in the step a) matches the preset target temperature; c) detecting a first electric power detection value of the first electric power to be supplied to the main heater, and calculating a second electric power target value by multiplying the first electric power detection value by the given ratio; and d) detecting a second electric power detection value of the second electric power to be supplied to the sub heater, and controlling the second electric power so that the second electric power detection value matches the second electric power target value.

According to this, it is possible to achieve a heating control method which is independent of a variation in characteristics among a plurality of heater power sources.

Advantageous Effects of Invention

The present invention yields an effect of achieving a heating control system which is independent of a variation in characteristics among a plurality of heater power sources.

For a fuller understanding of the nature and advantages of the invention, reference should be made to the ensuing detailed description taken in conjunction with the accompanying drawings.

DESCRIPTION OF EMBODIMENTS

First Embodiment

Figure 1:
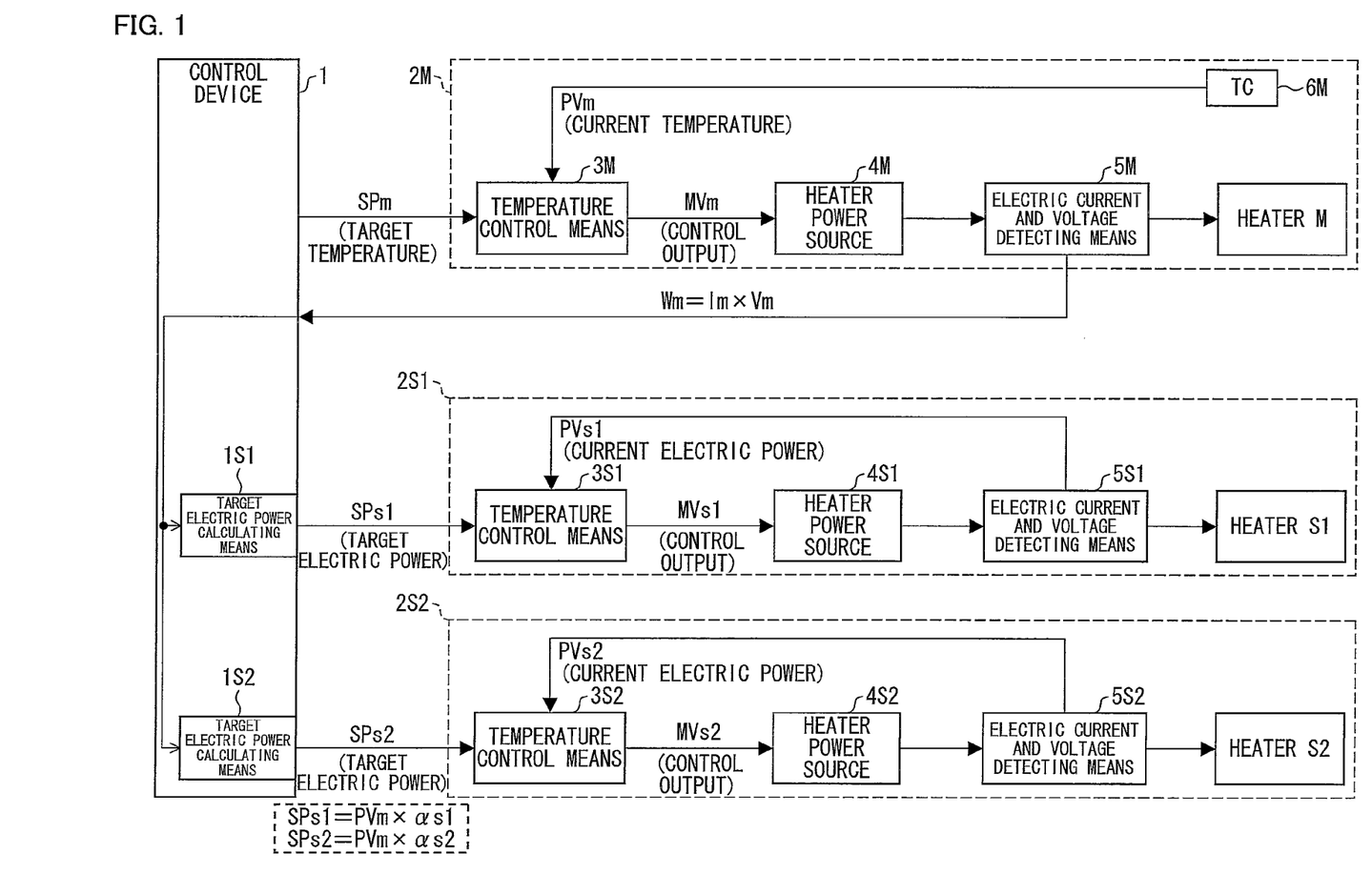
FIG. 1 is a block diagram showing an arrangement of a heating control system of a first embodiment of the present invention.

A first embodiment of the present invention is described below with reference to FIG. 1 and FIG. 2. FIG. 1 is a block diagram showing an arrangement of a heating control system of the present embodiment (hereinafter described as the present heating control system). Note that identical reference numerals indicate respective identical or corresponding parts in the drawings of the present invention.

The following description takes, as an example of the present heating control system, a heating control system which causes a main heater M and two sub heaters S1 and S2 to carry out three-zone temperature control. Note that a plurality of heaters to be used in the heating control system of the present embodiment is not limited to the above example. It is only necessary that the plurality of heaters include a main heater and a sub heater.

The present heating control system includes a control device 1, a main heater power source control system 2M which controls a power source for the main heater M, a sub heater power source control system 2S1 which controls a power source for the sub heater S1, and a sub heater power source control system 2S2 which controls a power source for the sub heater S2 (see FIG. 1).

The control device 1 includes target electric power calculating means 1S1 and 1S2 for the respective sub heaters S1 and S2. Such a control device 1 is exemplified by a control device such as a PLC (Programmable Logic Controller).

The main heater power source control system 2M includes temperature control means 3M (main heater temperature control means), a main heater power source 4M which is a power source for the main heater M, electric current and voltage detecting means 5M (main heater electric power detecting means) for detecting an electric current value and a voltage value which are supplied from the main heater power source 4M, the main heater M, and a thermocouple (TC) 6M (temperature detecting means) provided in a vicinity of the main heater M.

The sub heater power source control system 2S1 includes temperature control means 3S1 (sub heater temperature control means), a sub heater power source 4S1 which is a power source for the sub heater S1, electric current and voltage detecting means 5S1 (sub heater electric power detecting means) for detecting an electric current value and a voltage value which are supplied from the sub heater power source 4S1, and the sub heater S1. The sub heater power source control system 2S2 includes temperature control means 3S2 (sub heater temperature control means), a sub heater power source 4S2 which is a power source for the sub heater S2, electric current and voltage detecting means 5S2 (sub heater electric power detecting means) for detecting an electric current value and a voltage value which are supplied from the sub heater power source 4S2, and the sub heater S2.

Next, the following description discusses a temperature control method of the present embodiment (hereinafter described as the present temperature control method) by a heating control system. The present temperature control method is arranged as below. Temperature control is carried out with respect to the main heater M so that a detection temperature detected by the thermocouple 6M becomes a target temperature. Meanwhile, electric power control is carried out with respect to the sub heaters S1 and S2 so that an electric power value Wm to be supplied to the main heater M, and each of current electric powers PVs1 and PVs2 to be supplied to the respective sub heaters S1 and S2 are in a given ratio. Temperature control is thus carried out so that an object to be heated has a target temperature SPm. The present temperature control method includes the steps of: the temperature detection step of causing the thermocouple 6M to detect a temperature of an object to be heated; the main heater temperature control step; the target electric power calculation step; and the sub heater electric power control step.

In the main heater temperature control step, a current temperature PVm is controlled by power source control of the main heater M so that the detection temperature detected by the thermocouple 6M becomes the target temperature SPm. First, the control device 1 sets the target temperature SPm for the temperature control means 3M of the main heater power source control system 2M. The temperature control means 3M receives, as the current temperature PVm, the detection temperature detected by the thermocouple 6M provided in the vicinity of the main heater M. Based on the target temperature SPm and the current temperature PVm which have been supplied to the temperature control means 3M, the temperature control means 3M calculates, by PID arithmetic operation, a control output MVm to be supplied to the main heater power source 4M. The main heater power source 4M which has received the control output MVm supplies, to the main heater M, an electric current and a voltage each corresponding to the control output MVm. The main heater power source control system 2M causes the electric current and voltage detecting means 5M to detect an electric current value and a voltage value which are supplied to the main heater M. The control device 1 receives an electric current value Im and a voltage value Vm (the electric power value Wm=Im×Vm) which have been detected by the electric current and voltage detecting means 5M.

In the sub heater electric power control step, the current electric powers PVs1 and PVs2 to be supplied to the respective sub heaters S1 and S2 are detected, and electric power control is carried out by power source control of the sub heaters S1 and S2 so that the current electric powers PVs1 and PVs2 match respective target electric powers SPs1 and SPs2. A method for subjecting the sub heater S1 to electric power control is basically identical to a method for subjecting the sub heater S2 to electric power control. The method for subjecting the sub heater S1 to electric power control is described here.

First, the control device 1 sets the target electric power SPs1 for the temperature control means 3S1 of the sub heater power source control system 2S1. The temperature control means 3S1 receives, as the current electric power PVs 1, an electric power to be supplied to the sub heater S1. Note that the electric current and voltage detecting means 5S1 detects the current electric power PVs1. Based on the target electric power SPs1 and the current electric power PVs1 which have been supplied to the temperature control means 3S1, the temperature control means 3S1 calculates, by PID arithmetic operation, a control output MVs1 to be supplied to the sub heater power source 4S1. The sub heater power source 4S1 which has received the control output MVs1 supplies, to the sub heater S1, an electric current and a voltage each corresponding to the control output MVs1.

Note here that the target electric power calculating means 1S1 and 1S2 of the control device 1 calculate the respective target electric powers SPs1 and SPs2 of the respective sub heaters S1 and S2 in the target electric power calculation step. In the target electric power calculation step, the electric power value Wm to be supplied to the main heater M is detected, and the target electric powers SPs1 and SPs2 are calculated by multiplying the electric power value Wm by respective given ratios.

The target electric power calculating means 1S1 receives the electric power value Wm detected by the electric current and voltage detecting means 5M. The target electric power calculating means 1S1, which retains a ratio $\alpha s1$ of an electric power value of the sub heater S1 to the electric power value Wm (electric power value of the main heater M), calculates the target electric power SPs1 by multiplying the electric power value Wm by the ratio αs1. The target electric power SPs1 is represented by the following equation (3).

$$Sps1 = Wm \times \alpha s1 \tag{3}$$

As in the case of the target electric power calculating means 1S1, the target electric power calculating means 1S2 receives the electric power value Wm detected by the electric current and voltage detecting means 5M. The target electric power calculating means 1S2, which retains a ratio αs2 of an electric power value of the sub heater S2 to the electric power value Wm (electric power value of the main heater M), calculates the target electric power SPs2 by multiplying the electric power value Wm by the ratio αs2. The target electric power SPs2 is represented by the following equation (4).

$$Sps2 = Wm \times \alpha s2 \tag{4}$$

Figure 2:
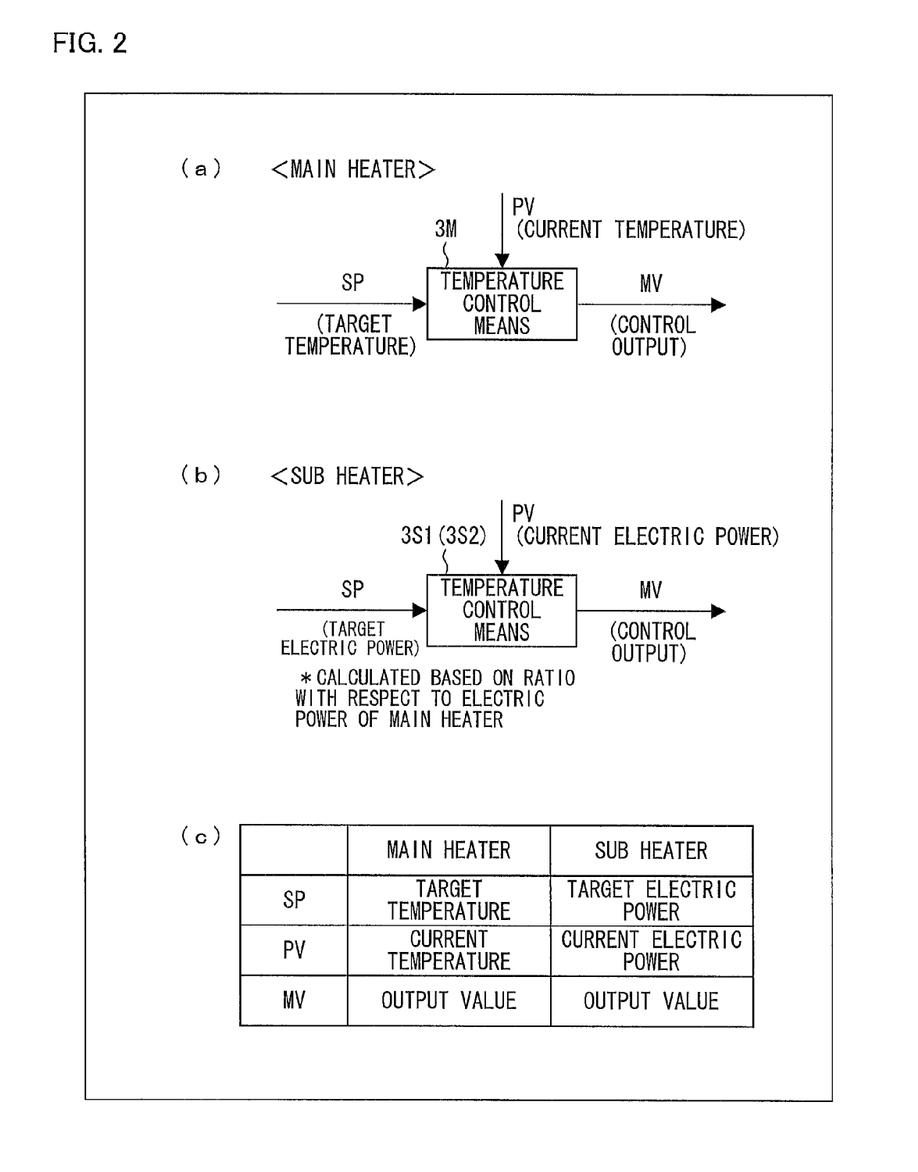
FIG. 2 shows a relationship between a control signal of a main heater and a control signal of a sub heater. (a) of FIG. 2 is a schematic view illustrating an input-output signal of temperature control means of the main heater. (b) of FIG. 2 is a schematic view illustrating an input-output signal of temperature control means of the sub heater. (c) of FIG. 2 is a table showing, for the main heater and the sub heater, signals supplied to/from the temperature control means.

FIG. 2 shows a relationship between a control signal of the main heater M and a control signal of the sub heater S1 or S2. (a) of FIG. 2 is a schematic view illustrating an input-output signal of the temperature control means 3M for outputting the control signal of the main heater M. (b) of FIG. 2 is a schematic view illustrating an input-output signal of the temperature control means 3S1 (3S2) for outputting the control signal of the sub heater S1 (S2). (c) of FIG. 2 is a table showing, for the main heater and the sub heater S1, signals supplied to/from the temperature control means. Note that in each of (a) through (c) of FIG. 2, for the main heater M and the sub heater S1, an input signal to be supplied from the control device or the target electric power calculating means to the temperature control means is described as "SP", an input signal to be fed back into the temperature control means is described as "PV", and an output signal of the temperature control means is described as "MV".

To the temperature control means 3M of the main heater power source control system 2M, the target temperature is supplied as a signal SP, and the detection temperature (current temperature) of the thermocouple 6M provided in the vicinity of the main heater M is supplied as a feedback signal PV (see (a) and (c) of FIG. 2).

To the temperature control means 3S1 (3S2) of the sub heater power source control system 2S1 (2S2), the target electric power is supplied as the signal SP, and the electric current value and the voltage value (current electric power) detected by the electric current and voltage detecting means 5S1 (5S2) is supplied as the feedback signal PV (see (b) and (c) of FIG. 2).

As described earlier, according to the present heating control system, the main heater power source control system 2M carries out temperature control by feeding back, into the temperature control means 3M, the detection temperature detected by the thermocouple 6M provided in the vicinity of the main heater M. Meanwhile, the sub heater power source control systems 2S1 and 2S2 carry out electric power control by feeding back respective detection electric powers of the respective electric current and voltage detecting means 5S1 and 5S2. This allows no consideration to be taken into a variation in output characteristics regardless of output specifications of the respective sub heater power sources S1 and S2.

According to the present heating control system, the electric power value of the main heater M is detected by the electric current and voltage detecting means 5M and supplied to the control device 1. Then, the target electric powers of the respective sub heaters S1 and S2 are set based on the electric power value of the main heater M which value has been supplied to the control device 1. In accordance with a change in electric power value of the main heater M, the target electric powers of the respective sub heaters S1 and S2 are set based on the respective preset ratios αs1 and αs2. In a case where the target electric powers of the respective sub heaters are thus calculated based on the respective given ratios with respect to the electric power value of the main heater, there occurs no variation between (i) an electric power ratio between the main heater and each of the sub heaters and (ii) the preset ratio αs1 or αs2, so that the electric power ratio is controlled to be constant.

The main heater M, and the sub heaters S1 and S2 differ in deterioration in resistance depending on in what environment they are used and/or of what types they are. Therefore, according to a conventional heating control system, resistances of the respective heaters change over time at different ratios in each zone. This prevents control adjusted values such as a P value, an I value, and a D value which are initialized for PID control from matching the resistances which change over time. This causes a problem of a deterioration in temperature stability.

According to the present heating control system, the main heater power source control system 2M, and the sub heater power source control systems 2S1 and 2S2 have the respective temperature control means (3M, 3S1, and 3S2) for carrying out PID control. Therefore, even in a case where a change over time in resistance of each of the main heater M, and the sub heaters S1 and S2 causes a change in balance among the respective resistances, individual adjustment of control parameters (P value, I value, and D value) with respect to the temperature control means 3M, 3S1, and 3S2 can prevent a variation in in-plane temperature distribution of an object to be heated while stably maintaining temperature controllability.

Second Embodiment

Figure 3:
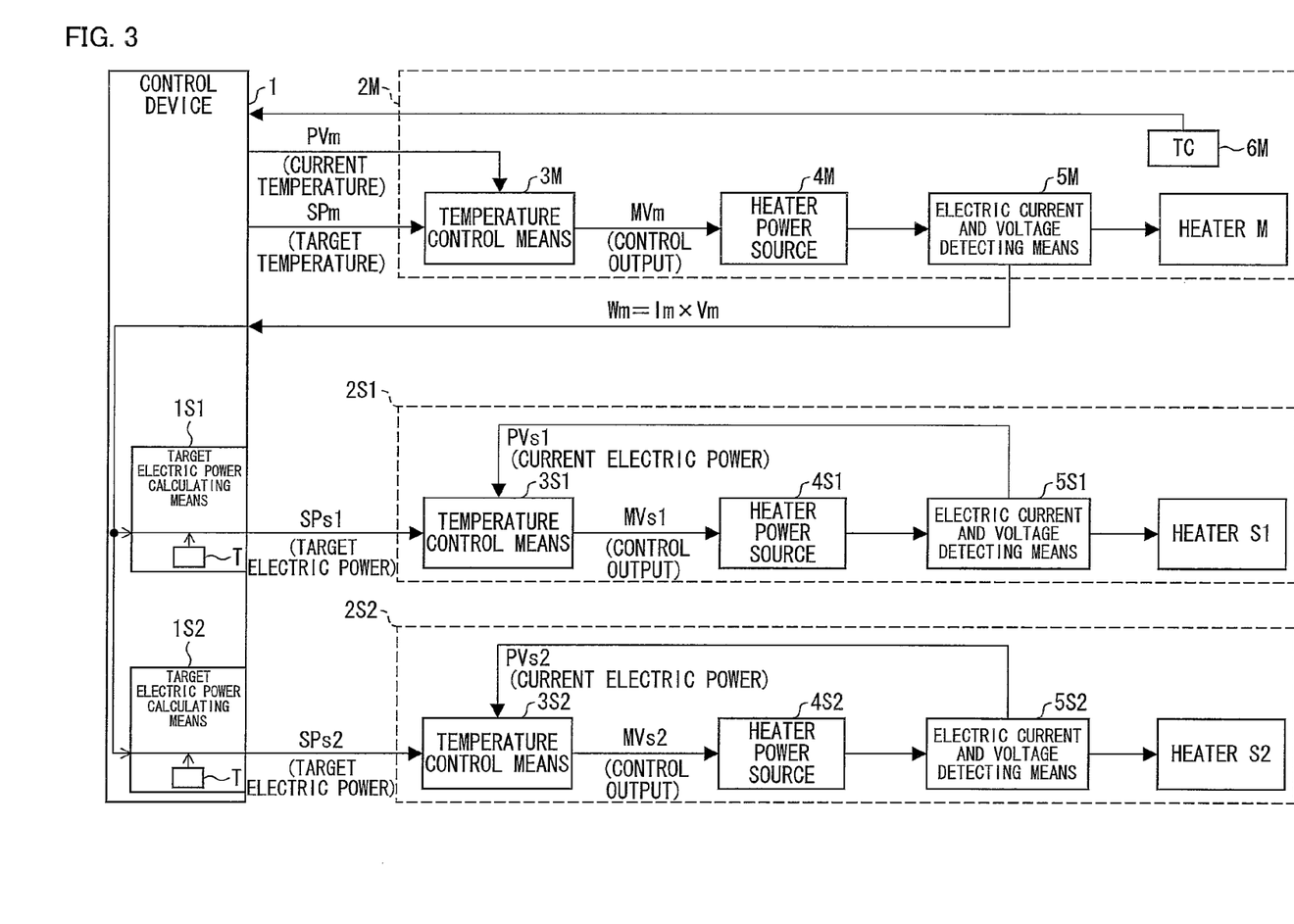
FIG. 3 is a block diagram showing an arrangement of a heating control system of a second embodiment of the present invention.

A second embodiment of the present invention is described below with reference to FIG. 3. FIG. 3 is a block diagram showing an arrangement of a heating control system of the present embodiment (hereinafter described as the present heating control system).

According to the present heating control system, a control device 1 receives a detection temperature detected by a thermocouple 6M provided in a vicinity of a main heater M (see FIG. 3). The control device 1 supplies the received detection temperature as a current temperature PVm to temperature control means 3M. Based on a target temperature SPm and the current temperature PVm which have been supplied to the temperature control means 3M, the temperature control means 3M calculates, by PID arithmetic operation, a control output MVm to be supplied to a main heater power source 4M.

According to the present heating control system, each of target electric power calculating means 1S1 and 1S2 retains a table T showing a relationship between the detection temperature (current temperature PVm) of the thermocouple 6M and each of ratios (αs1 and αs2). When the control device 1 receives the detection temperature (current temperature), the target electric power calculating means 1S1 compares the detection temperature and the table T, so as to determine the ratio αs1 which corresponds to the current temperature. Then, the target electric power calculating means 1S1 multiplies, by the ratio αs1, an electric power value Wm of the main heater M which value is supplied thereto, so as to calculate a target electric power SPs1. As in the case of the target electric power calculating means 1S1, when the control device 1 receives the detection temperature (current temperature), the target electric power calculating means 1S2 compares the detection temperature and the table T, so as to determine the ratio αs2 which corresponds to the current temperature. Then, the target electric power calculating means 1S2 multiplies, by the ratio αs2, the electric power value Wm of the main heater M which value is supplied thereto, so as to calculate a target electric power SPs2.

Figure 4:
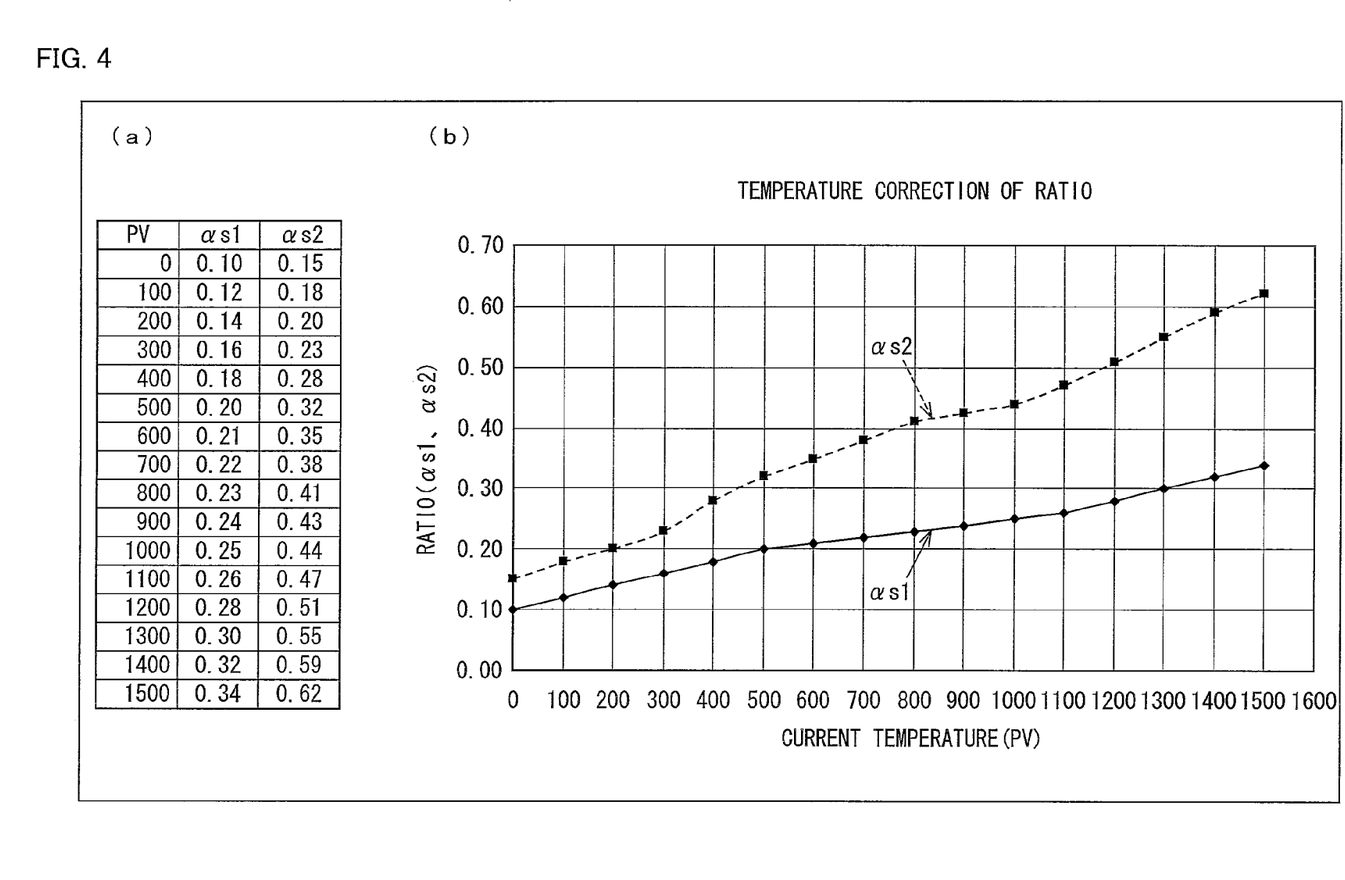
FIG. 4 shows a table retained by target electric power calculating means. (a) of FIG. 4 is a list which is stored in the table and shows a correspondence between a current temperature and each of given ratios. (b) of FIG. 4 is a graph showing the correspondence between the current temperature and each of the given ratios.

The following description specifically discusses the table T retained by each of the target electric power calculating means 1S1 and 1S2. FIG. 4 shows the table retained by each of the target electric power calculating means 1S1 and 1S2. (a) of FIG. 4 is a list which is stored in the table and shows a correspondence between the current temperature PVm and each of the ratios αs1 and αs2. (b) of FIG. 4 is a graph showing the correspondence between the current temperature PVm and each of the ratios αs1 and αs2.

For example, in a case where the current temperature PVm is 300° C., the target electric power calculating means 1S1 determines the ratio αs1=0.16, and the target electric power calculating means 1S2 determines the ratio αs2=0.23 (see the table T shown in (a) and (b) of FIG. 4). Then, the target electric power calculating means 1S1 and the target electric power calculating means 1S2 multiply the respective ratios αs1 and αs2 by the electric power value Wm, so as to calculate the respective target electric powers SPs1 and SPs2. Namely, according to the present heating control system, ratios of electric power values of respective sub heaters S1 and S2 with respect to the electric power value Wm of the main heater M are represented as respective functions (αs1 (PVm) and αs2 (PVm)) of the current temperature PVm. Accordingly, the target electric power SPs1 is defined as a function of PVm (see the following equation (5)).

$$SPs1=Wm\times\alpha s1(PVm) \quad (5)$$

As in the case of the target electric power SPs1, the target electric power SPs2 is defined as a function of PVm (see the following equation (6)).

$$SPs2=Wm\times\alpha s2(PVm) \quad (6)$$

The ratios of the electric power values of the respective sub heaters S1 and S2 with respect to the electric power value Wm of the main heater M are thus represented as the respective functions of the current temperature PVm. This allows the ratios of the electric power values of the respective sub heaters S1 and S2 to be adjusted in accordance with a temperature region of the detection temperature detected by the thermocouple 6M. Therefore, according to the present heating control system, three zones can be adjusted to have identical temperature distributions in the entire temperature region detected by the thermocouple 6M.

Third Embodiment

Figure 5:
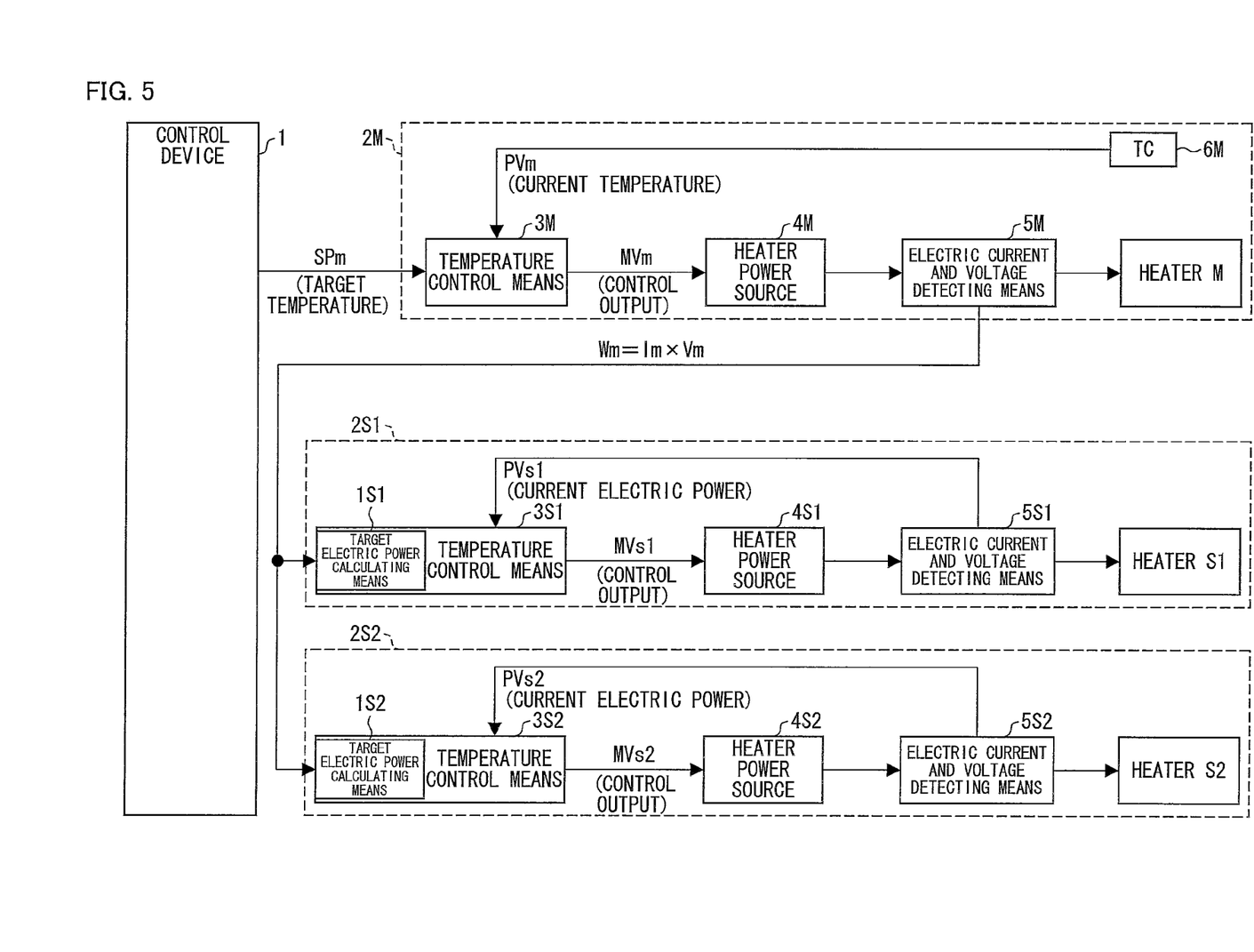
FIG. 5 is a block diagram showing an arrangement of a heating control system of a third embodiment of the present invention.

A third embodiment of the present invention is described below with reference to FIG. 5. FIG. 5 is a block diagram showing an arrangement of a heating control system of the present embodiment (hereinafter described as the present heating control system).

According to the present heating control system, target electric power calculating means 1S1 and 1S2 are provided in respective temperature control means 3S1 and 3S2 (see FIG. 5). A programmable temperature controller such as DMC 50 (produced by Azbil Corporation (formerly Yamatake Corporation)) can be used as each of such temperature control means 3S1 and 3S2.

According to the present heating control system, the temperature control means 3S1 of a sub heater power source control system 2S1 receives an electric power value Wm of a main heater and a current electric power PVs1 which is being supplied to a sub heater S1. The target electric power calculating means 1S1 retains a ratio αs1. When the temperature control means 3S1 receives the electric power value Wm of the main heater M, the target electric power calculating means 1S1 calculates a target electric power value of the sub heater S1 by multiplying the electric power value Wm by the ratio αS1. Based on the target electric power value calculated by the target electric power calculating means 1S1 provided in the temperature control means 3S1, the temperature control means 3S1 calculates, by PID arithmetic operation, a control output MVs1 to be supplied to a sub heater power source 4S1.

According to the present heating control system, the target electric power value of the sub heater S1 is thus calculated not in the control device 1 but in the temperature control means 3S1. Therefore, power source control of the sub heater S1 is carried out not via the control device 1. This makes it possible to carry out a temperature control process with respect to the sub heater S1 regardless of a processing time of the control device 1. Further, more zones can be heated (e.g., more sub heaters can be provided) without the need of changing a program of the control device 1. Accordingly, the present heating control system allows the temperature control process to be carried out in a shorter time.

Fourth Embodiment

Figure 6:
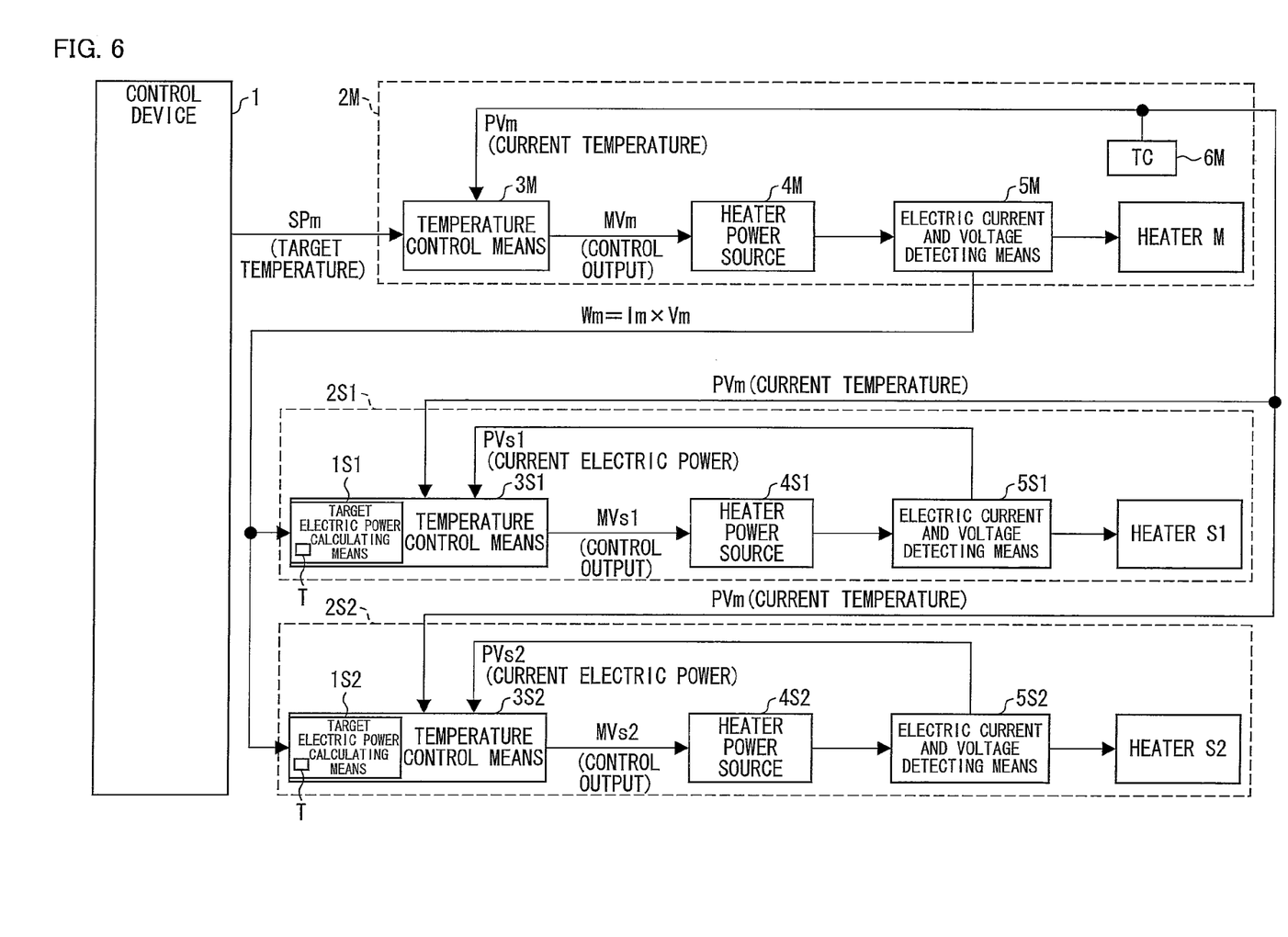
FIG. 6 is a block diagram showing an arrangement of a heating control system of a fourth embodiment of the present invention.

A fourth embodiment of the present invention is described below with reference to FIG. 6. FIG. 6 is a block diagram showing an arrangement of a heating control system of the present embodiment (hereinafter described as the present heating control system).

According to the present heating control system, target electric power calculating means 1S1 and 1S2 are provided in respective temperature control means 3S1 and 3S2, and a detection temperature (current temperature PVm) of a thermocouple 6M provided in a vicinity of a main heater M is supplied to each of the temperature control means 3S1 and 3S2 (see FIG. 6).

Each of target electric power calculating means 1S1 and 1S2 provided in the respective temperature control means 3S1 and 3S2 retains a table T showing a relationship between the detection temperature (current temperature PVm) of the thermocouple 6M and each of ratios (αs1 and αs2). The target electric power calculating means 1S1 which has received the detection temperature (current temperature) compares the detection temperature and the table T, so as to determine the ratio αs1 which corresponds to the current temperature. Then, the target electric power calculating means 1S1 multiplies, by the ratio αs1, an electric power value Wm of the main heater M which value is supplied thereto, so as to calculate a target electric power of a sub heater S1. As in the case of the target electric power calculating means 1S1, the target electric power calculating means 1S2 which has received the detection temperature (current temperature) compares the detection temperature and the table T, so as to determine the ratio αs2 which corresponds to the current temperature. Then, the target electric power calculating means 1S2 multiplies, by the ratio αs2, the electric power value Wm of the main heater M which value is supplied thereto, so as to calculate a target electric power of a sub heater S2.

Based on the target electric power calculated by the target electric power calculating means 1S1 provided in the temperature control means 3S1, the temperature control means 3S1 calculates, by PID arithmetic operation, a control output MVs1 to be supplied to a sub heater power source 4S1. Based on the target electric power calculated by the target electric power calculating means 1S2 provided in the temperature control means 3S2, the temperature control means 3S2 calculates, by PID arithmetic operation, a control output MVs1 to be supplied to a sub heater power source 4S2.

According to the present heating control system, the target electric powers of the respective sub heaters S1 and S2 are thus calculated not in the control device 1 but in the respective temperature control means 3S1 and 3S2. Therefore, power source control of the sub heaters S1 and S2 is carried out not via the control device 1. This makes it possible to carry out a temperature control process with respect to the sub heaters S1 and S2 regardless of a processing time of the control device 1. Further, more zones can be heated (e.g., more sub heaters can be provided) without the need of changing a program of the control device 1.

Further, each of the target electric power calculating means 1S1 and 1S2 retains the table T showing the relationship between the detection temperature (current temperature PVm) of the thermocouple 6M and each of the ratios ($\alpha s1$ and $\alpha s2$). Therefore, three zones can be adjusted to have identical temperature distributions in the entire temperature region detected by the thermocouple 6M.

(Deposition Device)

The present heating control system described earlier is applicable to a deposition device which deposits a thin film on a substrate. An MOCVD device in which an MOCVD method is used to cause a compound semiconductor crystal to grow is suitable as the deposition device to which the present heating control system is applicable. It is only necessary that the MOCVD device to which the present heating control system is applicable be a conventionally publicly-known device which subjects a substrate to zone heating.

Figure 8:
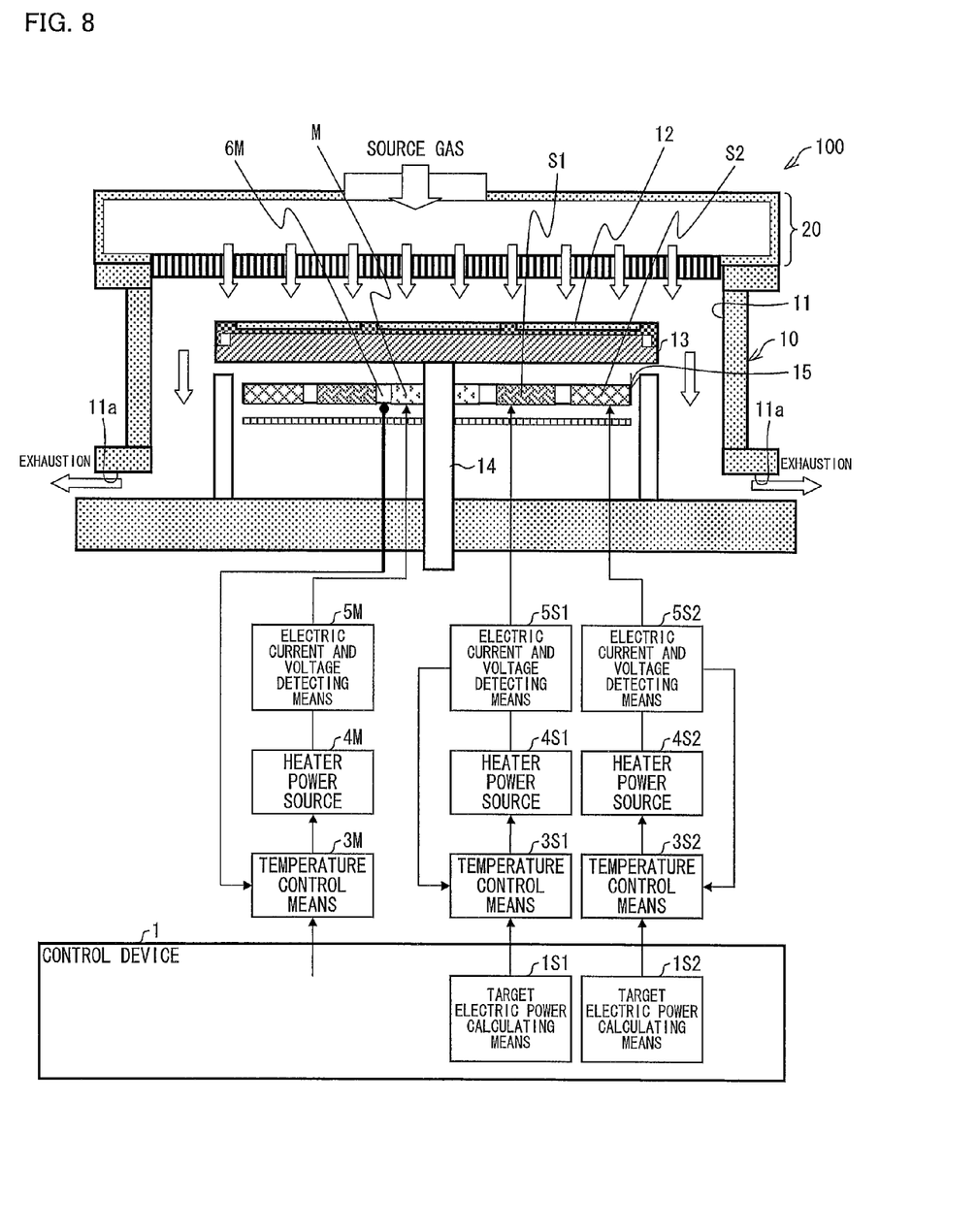
FIG. 8 is a cross-sectional view schematically showing an arrangement of an MOCVD device that is an example of a deposition device to which a heating control system of an embodiment of the present invention is applied.

FIG. 8 is a cross-sectional view schematically showing an arrangement of an MOCVD device that is an example of a deposition device to which the present heating control system is applied.

An MOCVD device 100 includes a reactor 10, a substrate retaining member 13, and a gas supplying section 20. The reactor 10 has a reaction chamber 11 which retains an airtight state by isolating an inside thereof from the atmosphere side and serves as a growth chamber. The substrate retaining member 13 is provided in the reaction chamber 11, and places thereon a plurality of substrates to be processed 12. The gas supplying section 20 is provided so as to face the substrate retaining member 13, and supplies a plurality of source gases to the plurality of substrates to be processed 12.

The substrate retaining member 13 is provided at an end of a rotating transmitting member 14. The rotating transmitting member 14 is rotatable by a rotating mechanism (not illustrated). A substrate heating heater 15 is provided under the substrate retaining member 13.

Thin films are deposited on respective main surfaces of the respective plurality of substrates to be processed 12 in the MOCVD device 100 by injecting the plurality of source gases from the gas supplying section 20 into the reaction chamber 11. In this case, the plurality of substrates to be processed 12 are heated by the substrate heating heater 15 via the substrate retaining member 13, and a deposition chemical reaction is promoted on the plurality of substrates to be processed 12, so that the thin films are deposited on the respective plurality of substrates to be processed 12. The gases having passed through the plurality of substrates to be processed 12 outgo via gas outlets 11a. The gas supplying section 20 provided in an upper part of the reactor 10 has a substantially cylindrical shape.

The substrate heating heater 15 includes a main heater M, a sub heater S1, and a sub heater S2. The main heater M, the sub heater S1, and the sub heater S2, each of which is concentrically circular on an axis of the rotating transmitting member 14, are provided outward from the rotating transmitting member 14 in this order.

In order to cause a temperature of the plurality of substrates to be processed 12 to be uniform, the MOCVD device 100 causes the main heater M, the sub heater S1, and the sub heater S2 to carry out zone control. The heating control system of the present embodiment is applied to the MOCVD device 100 so that this zone control is carried out.

It can also be described that a heating control system of the present invention has the following characteristic arrangement. Namely, it can also be described that the heating control system of the present invention is preferably arranged to include: a main heater and a plurality of sub heaters each of which heats an object to be heated; heater power sources which supply electric powers to the main heater and the plurality of sub heaters, respectively; temperature control means for controlling the respective heater power sources; electric current and voltage detecting means for detecting electric currents and voltages to be supplied to the main heater and the plurality of sub heaters, respectively; temperature detecting means which is located in a vicinity of the object to be heated; and target electric power calculating means for calculating respective target electric powers of the respective plurality of sub heaters, the heating control system controlling, in accordance with a detection temperature detected by the temperature detecting means, the main heater to have a target temperature, and the heating control system controlling electric currents and voltages (electric power values) to be supplied to the respective plurality of sub heaters to have respective target electric power values calculated by the respective target electric power calculating means in accordance with (i) a detected electric current and a detected voltage which are supplied to the main heater and (ii) respective predetermined ratios. According to the arrangement, it is preferable that the predetermined ratios which are used to calculate the respective target electric power values of the respective plurality of sub heaters be changeable in accordance with a current temperature. According to the arrangement, it is preferable that the target electric power calculating means be provided in the respective temperature control means.

As described earlier, a heating control system of the present invention includes: a main heater and a sub heater each of which is used to heat an object to be heated; and a main heater power source which supplies a first electric power to the main heater, and a sub heater power source which supplies a second electric power to the sub heater, the main heater being subjected to temperature control so that the object to be heated has a preset target temperature, and the sub heater being subjected to electric power control so that the first electric power to be supplied to the main heater and the second electric power to be supplied to the sub heater are in a given ratio, the heating control system further including: temperature detecting means for detecting a detection temperature of the object to be heated; main heater temperature control means and sub heater temperature control means; main heater electric power detecting means for detecting a first electric power detection value, and sub heater electric power detecting means for detecting a second electric power detection value; and target electric power calculating means for calculating a second electric power target value, the main heater temperature control means receiving the preset target temperature and the detection temperature detected by the temperature detecting means, and controlling the first electric power so that the detection temperature matches the preset target temperature, the target electric power calculating means receiving the first electric power detection value detected by the main heater electric power detecting means, and calculating the second electric power target value by multiplying the first electric power detection value by the given ratio, and the sub heater temperature control means receiving the second electric power target value and the second electric power detection value detected by the sub heater electric power detecting means, and controlling the second electric power so that the second electric power detection value matches the second electric power target value.

As described earlier, a deposition device of the present invention includes a heating control system mentioned above.

As described earlier, a temperature control method of the present invention in which in order to cause a main heater and a sub heater to heat an object to be heated, the main heater is subjected to temperature control so that the object to be heated has a preset target temperature, and the sub heater is subjected to electric power control so that a first electric power to be supplied to the main heater and a second electric power to be supplied to the sub heater are in a given ratio, the temperature control method includes the steps of: a) detecting a detection temperature of the object to be heated; b) controlling the first electric power so that the detection temperature detected in the step a) matches the preset target temperature; c) detecting a first electric power detection value of the first electric power to be supplied to the main heater, and calculating a second electric power target value by multiplying the first electric power detection value by the given ratio; and d) detecting a second electric power detection value of the second electric power to be supplied to the sub heater, and controlling the second electric power so that the second electric power detection value matches the second electric power target value.

This yields an effect of achieving a heating control system which is independent of a variation in characteristics among a plurality of heater power sources.

The heating control system of the present invention is preferably arranged such that the target electric power calculating means retains a table showing a relationship between the detection temperature and the given ratio, and compares the detection temperature supplied thereto and the table, so as to determine the given ratio.

According to the arrangement, the target electric power calculating means retains a table showing a relationship between the detection temperature and the given ratio, and compares the detection temperature supplied thereto and the table, so as to determine the given ratio. This allows a change in ratio between the first electric power and the second electric power in accordance with the detection temperature. According to this, it is possible to carry out heating control having a suitable temperature distribution in the entire temperature region from a low temperature region to a high temperature region of the detection temperature detected by the temperature detecting means.

The heating control system of the present invention is preferably arranged such that the target electric power calculating means is provided in the sub heater temperature control means.

According to the arrangement, in a case where the sub heater temperature control means is used in which a function of calculating the second electric power target value is provided, the sub heater temperature control means alone makes it possible to carry out a temperature control process. Therefore, as compared to a case of, for example, causing a control device such as a PLC to calculate the second electric power target value, the arrangement makes it possible to build a temperature control loop which is independent of a processing time of a control device.

In order to attain the object, a deposition device of the present invention includes a heating control system mentioned above.

In a case where the heating control system mentioned above is used for a deposition device, a substrate temperature distribution can be reproduced during replacement of heaters and/or with respect to a change over time in heater resistance. This makes it possible to deposit a compound semiconductor crystal having a stable characteristic.

The invention is not limited to the description of the embodiments above, but may be altered within the scope of the claims. An embodiment based on a proper combination of technical means disclosed in different embodiments is encompassed in the technical scope of the invention.

INDUSTRIAL APPLICABILITY

The present invention is usable in a case where temperature control is carried out in a device such as a deposition device which causes a plurality of heaters to heat an object to be heated.

REFERENCE SIGNS LIST

1 Control device
1S1, 1S2 Target electric power calculating means
2M Main heater power source control system
3M Temperature control means (Main heater temperature control means)
4M Main heater power source
5M Electric current and voltage detecting means (Main heater electric power detecting means)
6M Thermocouple (Temperature detecting means)
2S1, 2S2 Sub heater power source control system
3S1, 3S2 Temperature control means (Sub heater temperature control means)
4S1, 4S2 Sub heater power source
5S1, 5S2 Electric current and voltage detecting means (Sub heater electric power detecting means)
SPm Target temperature (Preset target temperature)
PVm Current temperature (Detection temperature)
Wm Electric power value (First electric power detection value)
SPs1, SPs2 Target electric power (Second electric power target value)
PVs1, PVs2 Current electric power (Second electric power detection value)
T Table

The invention claimed is:
1. A heating control system comprising:
a main heater and a sub heater each of which is used to heat an object to be heated; and
a main heater power source which supplies a first electric power to the main heater, and a sub heater power source which supplies a second electric power to the sub heater,
the main heater being subjected to temperature control so that the object to be heated has a preset target temperature, and
the sub heater being subjected to electric power control so that the first electric power to be supplied to the main heater and the second electric power to be supplied to the sub heater are in a given ratio, said heating control system further comprising:
- temperature detecting means for detecting a detection temperature of the object to be heated;
- main heater temperature control means and sub heater temperature control means;
- main heater electric power detecting means for detecting a first electric power detection value, and sub heater electric power detecting means for detecting a second electric power detection value; and
- target electric power calculating means for calculating a second electric power target value,
- the main heater temperature control means receiving the preset target temperature and the detection temperature detected by the temperature detecting means, and controlling the first electric power so that the detection temperature matches the preset target temperature,
- the target electric power calculating means receiving the first electric power detection value detected by the main heater electric power detecting means, and calculating the second electric power target value by multiplying the first electric power detection value by the given ratio, and
- the sub heater temperature control means receiving the second electric power target value and the second electric power detection value detected by the sub heater electric power detecting means, and controlling the second electric power so that the second electric power detection value matches the second electric power target value.

2. The heating control system as set forth in claim 1, wherein the target electric power calculating means retains a table showing a relationship between the detection temperature and the given ratio, and compares the detection temperature supplied thereto and the table, so as to determine the given ratio.

3. The heating control system as set forth in claim 1, wherein the target electric power calculating means is provided in the sub heater temperature control means.

4. A deposition device comprising a heating control system recited in claim 1.

5. A temperature control method in which in order to cause a main heater and a sub heater to heat an object to be heated, the main heater is subjected to temperature control so that the object to be heated has a preset target temperature, and the sub heater is subjected to electric power control so that a first electric power to be supplied to the main heater and a second electric power to be supplied to the sub heater are in a given ratio, said temperature control method comprising the steps of:
- a) detecting a detection temperature of the object to be heated;
- b) controlling the first electric power so that the detection temperature detected in the step a) matches the preset target temperature;
- c) detecting a first electric power detection value of the first electric power to be supplied to the main heater, and calculating a second electric power target value by multiplying the first electric power detection value by the given ratio; and
- d) detecting a second electric power detection value of the second electric power to be supplied to the sub heater, and controlling the second electric power so that the second electric power detection value matches the second electric power target value.

* * * * *